(12) United States Patent
Tomioka

(10) Patent No.: US 6,656,816 B2
(45) Date of Patent: Dec. 2, 2003

(54) METHOD FOR MANUFACTURING SEMICONDUCTOR DEVICE

(75) Inventor: Yugo Tomioka, Tateyama (JP)

(73) Assignee: UMC Japan, Chiba-ken (JP)

(*) Notice: Subject to any disclaimer, the term of this patent is extended or adjusted under 35 U.S.C. 154(b) by 0 days.

(21) Appl. No.: 10/142,700

(22) Filed: May 10, 2002

(65) Prior Publication Data

US 2003/0013257 A1 Jan. 16, 2003

(30) Foreign Application Priority Data

Jul. 13, 2001 (JP) .................................... P2001-214394

(51) Int. Cl.[7] .............................................. H01L 21/76
(52) U.S. Cl. ...................... 438/424; 438/425; 438/427; 438/294; 438/296
(58) Field of Search ................................ 438/424, 253, 438/396, 239, 201, 211, 262, 656, 294, 296, 199, 218, 221, 433, 524, 425, 427

(56) References Cited

U.S. PATENT DOCUMENTS 4,523,369 A * 6/1985 Nagakubo .................... 43/433

2002/0093071 A1 * 7/2002 Chheda et al. ............... 257/510

* cited by examiner

*Primary Examiner*—Matthew Smith
*Assistant Examiner*—Igwe W. Anya
(74) *Attorney, Agent, or Firm*—Scully, Scott, Murphy & Presser

(57) ABSTRACT

A method for manufacturing a semiconductor device enables the formation of a well optimized for a fine MOS transistor and a well formed deep with a relatively low concentration for a high voltage MOS transistor without increasing the number of manufacturing steps. The method for manufacturing a semiconductor device includes the steps of: forming a first ion implantation expendable film and an etching mask film on a first conductive type semiconductor substrate; patterning the etching mask film into a shape of an active and field region; introducing dopant into the substrate; forming a trench groove on the substrate; forming an insulation film in the trench groove; forming a first well; flattening the insulation film; removing the etching mask film; removing the expendable film; forming a second ion implantation expendable film on the substrate; forming a mask pattern; and forming a second well by introducing dopant into the substrate.

16 Claims, 2 Drawing Sheets

METHOD FOR MANUFACTURING SEMICONDUCTOR DEVICE

BACKGROUND OF THE INVENTION

1. Field of the Invention

The present invention relates to methods for manufacturing a semiconductor device. More specifically, the present invention relates to a method for manufacturing a semiconductor device on which a fine metal oxide semiconductor (MOS) transistor having a shallow trench isolation (STI) structure and a high voltage MOS transistor are mounted in combination.

2. Description of Related Art

Conventionally, formation of a well on a MOS type semiconductor device on which a fine MOS transistor having a local oxidization of silicon (LOCOS) isolation structure and a high voltage MOS transistor are mixed mounted is carried out by using a method shown in FIGS. 2A through 2E.

In FIG. 2A, the numeral 200 indicates a p-type silcon substrate. A silicon thermal oxide film 201 is formed on the p-type silicon substrate 200, and a silicon nitride film 202 is formed on the silicon thermal oxide film 201. Then, a resist 203 is formed on a part of the silicon nitride film 202 corresponding to an isolation area, and the part of the silicon nitride film 202 is pattern-removed using the resist 203 so that a LOCOS oxide film 204 is grown as shown in FIG. 2B.

After this, as shown in FIG. 2C, an ion implantation process is carried out using a photoresist 205 as a mask in order to form a well for a high voltage MOS transistor. Then, as shown in FIG. 2D, another ion implantation process is carried out using a photoresist 206 as a mask in order to form a well for a fine MOS transistor. One of the reasons why the ion implantation processes for the wells are performed in two steps is that a relatively low concentration and deep well is required for the high voltage MOS transistor, and a well which is optimized for ensuring excellent MOS transistor characteristics in, for instance, saturation current, punch through, and sub-threshold is required for the fine MOS transistor.

After carrying out the ion implantation processes, a well diffusion process is carried out at high temperature for a long period of time to form a well 207 for the high voltage MOS transistor and a well 208 for the fine MOS transistor as shown in FIG. 2E. After this, although not shown in the figures, a gate oxide film, a gate electrode, and a source drain diffusion layer are formed to produce the high voltage MOS transistor and the fine MOS transistor, respectively.

Also, a well of a MOS type semiconductor device may be produced by using the following method.

In a fine MOS transistor, since a well which is optimized for ensuring excellent MOS transistor characteristics in, for instance, saturation current, punch through, and sub-threshold is required, a well having a dopant (impurity) concentration distribution in the depth direction (hereinafter referred to as a retrograded well) may sometimes be used. The retrograded well is formed via a plurality of ion implantation processes in which the acceleration energy for implanting ions is optimized.

In the above method, since a thermal treatment at high temperature for a long period of time is not suitable, after an ion implantation process for a well for the high voltage MOS transistor shown in FIG. 2C is carried out, a well diffusion process, which is a thermal treatment of high temperature for a long time is carried out to form a well for the high voltage MOS. Then, an ion implantation process for forming a well for the fine MOS transistor is carried out.

Recently, in a fine MOS transistor having improved fineness, the latter method described above as a conventional method is adopted for forming a well in order to obtain excellent MOS transistor characteristics. Also, in the isolation structure, use of the STI is increasing as compared to that of the LOCOS which requires a relatively large isolation width.

In the process of forming a well for the above fine MOS transistor, although a thermal treatment process of high temperature and long period of time is not necessary, it is required to additionally carry out a well diffusion process of high temperature and long period of time in order to form a well for a high voltage MOS transistor. Accordingly, the number of processes is increased and problems may be generated due to the complication in the well formation process.

SUMMARY OF THE INVENTION

The present invention takes into consideration the above-mentioned circumstances, and has an object to provide a method for producing a well which is optimized for a fine MOS transistor and a well which is deep and at a relatively low concentration for a high voltage MOS transistor in a MOS type semiconductor device having a STI structure without increasing the number of manufacturing steps when a fine MOS transistor having excellent MOS transistor characteristics and a high voltage MOS transistor having a high voltage are mounted in combination.

In order to achieve the above objects, the present invention provides a method for manufacturing a semiconductor device, comprising the steps of: forming a first ion implantation expendable film on a first conductive type semiconductor substrate; forming a film for etching mask on the first ion implantation expendable film; patterning the film for etching mask into a shape of an active region and of a field region; forming a mask pattern of a predetermined shape by a photolithography method in accordance with the film for etching mask which has been patterned; introducing a first or second conductive type dopant into the first conductive type semiconductor substrate; forming a trench groove on the first conductive type semiconductor substrate, after removing the mask pattern, by an etching method using the film for etching mask as a mask; forming an insulation film in the trench groove; forming a first well by carrying out an annealing thermal treatment; flattening the insulation film; selectively removing the film for etching mask; removing the whole of the first ion implantation expendable film; forming a second ion implantation expendable film on the first conductive type semiconductor substrate; forming a mask pattern of a predetermined shape by a photolithography method in accordance with the trench groove; and forming a second well by introducing another first or second conductive type dopant into the first conductive type semiconductor substrate.

In accordance with another aspect of the present invention, in the above method for manufacturing a semiconductor device, the first well is a well for a high voltage metal oxide semiconductor (MOS) transistor, and the second well is a well for a fine metal oxide semiconductor transistor.

In yet another aspect of the present invention, the above step for forming the second well by introducing first or second conductive type dopant into the first conductive type semiconductor substrate comprises a plurality of ion introducing steps.

In yet another aspect of the present invention, in the above method for manufacturing a semiconductor device, the temperature of the annealing thermal treatment is in a range between about 1,000 and 1,200° C.

In yet another aspect of the present invention, in the above method for manufacturing a semiconductor device, the step of forming the insulation film in the trench groove comprises a step of forming a first insulation film on inner surfaces of the trench groove and a step of forming a second insulation film for filling the trench groove.

According to the method for manufacturing a semiconductor device described above, after an ion implantation process for a well for a high voltage MOS transistor is carried out prior to the formation of STI, a thermal treatment is performed for repairing crystal defects subsequent to filling an insulation film for the trench groove when the STI is formed so that the well for the high voltage MOS transistor is diffused and the well for the fine MOS transistor is then produced. Accordingly, the thermal treatment process for repairing crystal defects, which is indispensable for the formation of the STI, can be used for the well diffusion process. Hence, since it is not necessary to add a well diffusion process carried out at high temperature and for a long period of time for producing a well for a high voltage MOS transistor, it becomes possible to produce a deep well of relatively low concentration without increasing the number of manufacturing steps.

BRIEF DESCRIPTION OF THE DRAWINGS

Some of the features and advantages of the invention have been described, and others will become apparent from the detailed description which follows and from the accompanying drawings, in which.

DETAILED DESCRIPTION OF THE INVENTION

The invention summarized above and defined by the enumerated claims may be better understood by referring to the following detailed description, which should be read with reference to the accompanying drawings. This detailed description of particular preferred embodiments, set out below to enable one to build and use particular implementations of the invention, is not intended to limit the enumerated claims, but to serve as particular examples thereof.

Hereinafter, an embodiment according to the present invention will be described in detail with reference to the accompanied drawings.

FIGS. 1A through 1F are diagrams for explaining a method for producing a well in a MOS type semiconductor device in which a fine MOS transistor having a STI structure and a high voltage MOS transistor are mounted in combination according to an embodiment of the present invention.

Figure 1A:
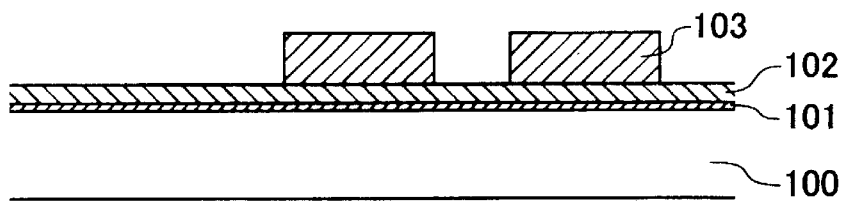
FIGS. 1A through 1F are diagrams explaining a method for producing a well in a MOS type semiconductor device according to an embodiment of the method for manufacturing a semiconductor device of the present invention.

FIG. 1A, the numeral 100 indicates a P-type silicon substrate used as a first conductive type semiconductor substrate. A silicon thermal oxide film 101 having a thickness of about 10–20 nm, for instance, is formed on the P-type silicon substrate 100 as a first ion implantation expendable film using a thermal oxidation method, and a silicon nitride film 102 having a thickness of about 100–200 nm is formed on the silicon thermal oxide film 101 as an etching mask using, for instance, a chemical vapor deposition (CVD) method. Then, the silicon nitride film 102 is patterned using a photoresist 103 as a mask in order to define an active region and a field region.

Figure 1B:
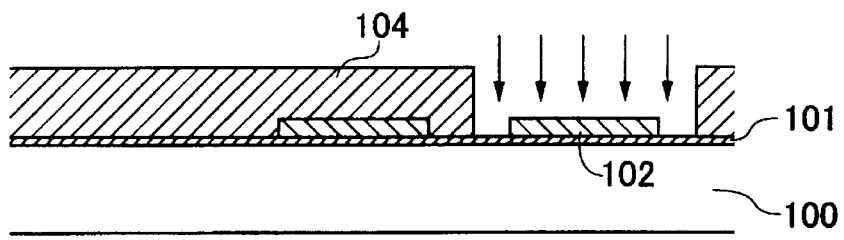

After this, as shown in FIG. 1B, an ion plantation process is performed for a well for a high voltage MOS transistor. At that time, a photoresist 104 is pattern-formed using a photolithography method along the difference in level of the patterned silicon nitride film 102. As a first or a second conductive type dopant to be implanted, phosphorus or boron is employed. The conditions for the ion implantation process in the case of an NMOS are: type of ion of B+ (boron), acceleration energy of 200–400 keV, and a dose amount of $1-5 \times 10^{12}$ cm$^{-2}$. In the case of a PMOS, the conditions for the ion implantation are: type of ion of P+ (phosphorus), acceleration energy of 300–500 keV, and a dose amount of $5-20 \times 10^{12}$ cm$^{-2}$.

Figure 1C:
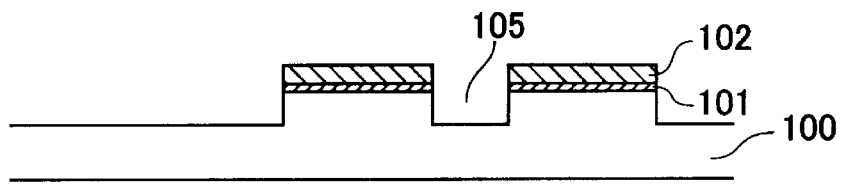
Figure 1D:
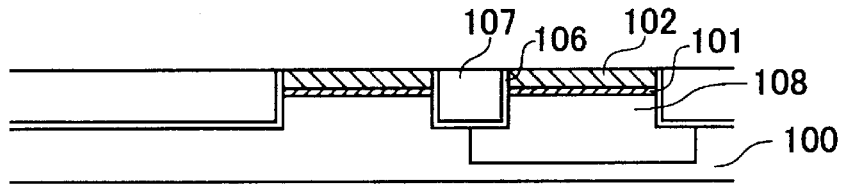

Then, as shown in FIG. 1C, the P-type silicon substrate 100 is etched by using the silicon nitride film 102 as a mask after removing the mask pattern to form a trench groove 105. After this, as shown in FIG. 1D, for instance, a silicon thermal oxide film 106 having a thickness of about 10–30 nm is formed on the inner surfaces of the trench groove 105 as a first insulation film using a thermal oxidation process. As a second insulation film, for instance, a high density plasma oxide film 107 having a thickness of about 500–1,000 nm is deposited using a plasma CVD method, and a crystal defect caused by the trench etching is recovered by a dry oxidation process of about 1,000–1,200° C.

Figure 1E:
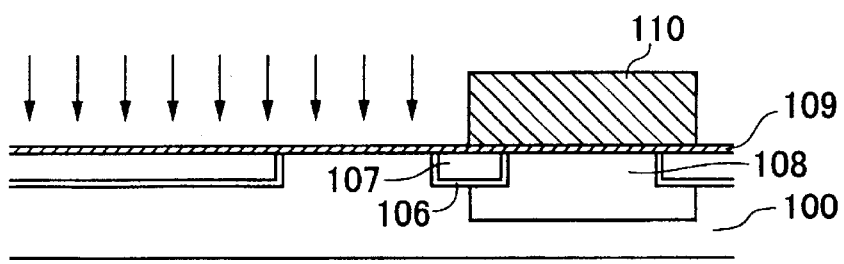

Then, as shown in FIG. 1E, the silicon nitride film 102 is selectively removed by a wet etching process using hot phosphoric acid. After the silicon thermal oxide film 101 is completely removed using hydrofluoric acid, a silicon thermal oxide film 109 having a thickness of about 10–20 nm is formed as a second ion implantation expendable film by using, for instance, a thermal oxidation method.

By this thermal treatment, a well diffusion is performed and a well 108 for a high voltage MOS transistor is formed. The well dopant (impurity) concentration is in the range of about $5-50 \times 10^{15}$ cm$^{-3}$, and the depth of the well is in the range of about 2–3 μm. After this, the surface of the high density plasma oxide film 107 is flattened using a chemical-mechanical polishing (CMP) method.

Then, as shown in FIG. 1E, the silicon nitriding film 102 is selectively removed by a wet etching process using hot phosphoric acid. After the silicon thermal oxide film 101 is completely removed using hydrofluoric acid, a silicon thermal oxide film 109 having a thickness of about 10–20 nm is formed as a second ion implantation expendable film by using, for instance, a thermal oxidation method.

Subsequently, using a photolithography method, a mask pattern is formed in a predetermined shape along the trench groove using a photoresist 110 as a mask, and an ion implantation process for a well for a fine MOS transistor is carried out. The ion implantation process includes two steps, and the conditions of each step, in the case of an NMOS are: type of ion of B+ (boron), acceleration energy of 300–600 keV, and a dose amount of $1-5 \times 10^{13}$ cm$^{-2}$, and type of ion of B+ (boron), acceleration energy of 100–200 keV, and a dose amount of $1-5 \times 10^{12}$ cm$^{-2}$. The acceleration energy in the ion implantation process may be varied if necessary.

Figure 1F:
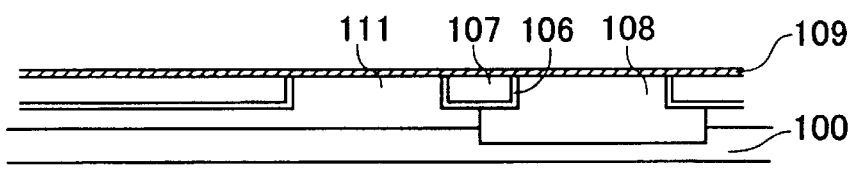
Figure 2A:
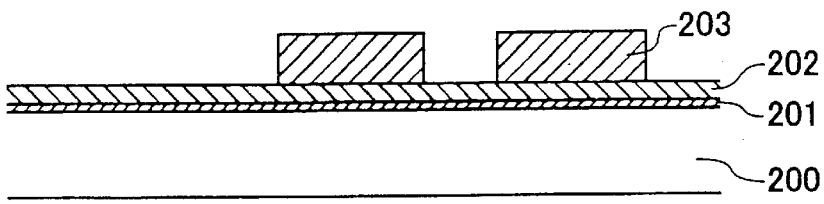
FIGS. 2A through 2E are diagrams explaining a conventional method for producing a well in a MOS type semiconductor device.
Figure 2B:
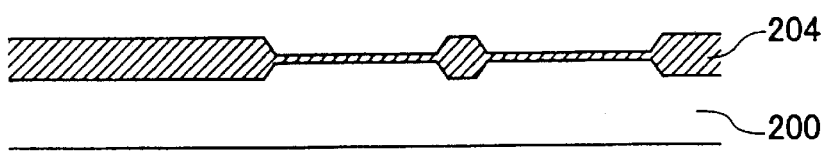
Figure 2C:
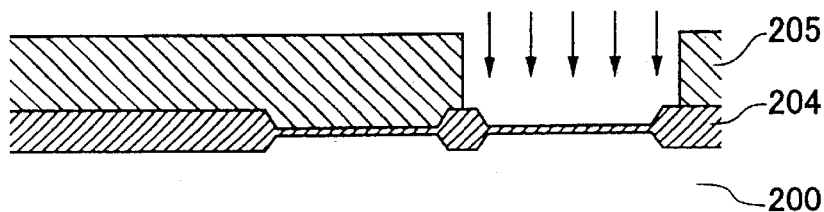
Figure 2D:
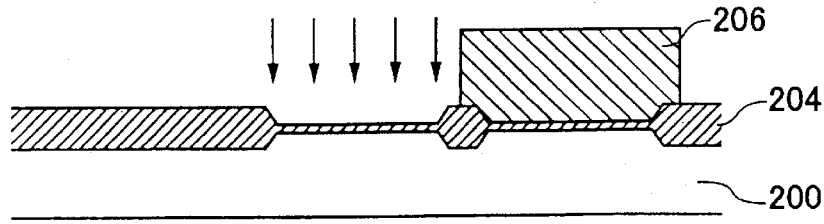
Figure 2E:
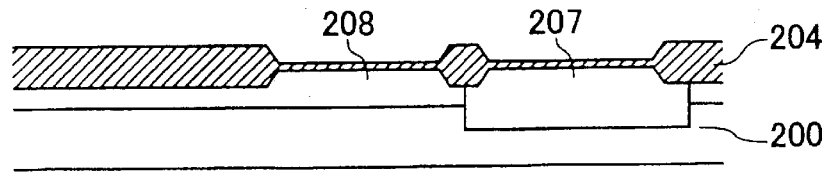

In the case of a PMOS, the conditions for the ion implantation process in each step are: type of ion of P+ (phosphorus), acceleration energy of 500–1,000 keV, and a dose amount of 1–5×10$^{13}$ cm$^{-2}$, and type of ion of P+ (phosphorus), acceleration energy of 100–300 keV, and a dose amount of 1–10×10$^{12}$ cm$^{-2}$. The acceleration energy in the ion implantation process for the PMOS may be varied if necessary. As a result of the ion implantation, a well 111 for a fine MOS transistor as shown in FIG. 1F may be formed.

After this, each of the high voltage MOS transistor and the fine MOS transistor is formed.

Note that although the explanation is made in the above embodiments for the case where the high voltage NMOS transistor and the fine NMOS transistor are mixed mounted on the p-type silicon substrate, or the case where the high voltage PMOS transistor and the fine PMOS transistor are mixed mounted on the p-type silicon substrate, it is possible to form a well by using a similar method in a CMOS mixed mount in which high voltage NMOS and PMOS transistors and fine NMOS and PMOS transistors are combined.

According to the method for manufacturing the MOS type semiconductor, after an ion implantation process for a well for a high voltage MOS transistor is carried out prior to the formation of STI, a thermal treatment is performed for repairing crystal defects subsequent to filling an insulation film for the trench groove 107 when the STI is formed so that the well 108 for the high voltage MOS transistor is diffused and the well 111 for the fine MOS transistor is subsequently produced. Accordingly, the thermal treatment process for repairing crystal defects, which is indispensable for the formation of the STI, can be used for the well diffusion process. Hence, since it is not necessary to additionally carry out a well diffusion process at high temperature and for a long period of time to produce a well for a high voltage MOS transistor, it becomes possible to produce a deep well of relatively low concentration without increasing the number of manufacturing steps.

Having thus described exemplary embodiments of the invention, it will be apparent that various alterations, modifications, and improvements will readily occur to those skilled in the art. Such alterations, modifications, and improvements, though not expressly described above, are nonetheless intended and implied to be within the spirit and scope of the invention. Accordingly, the foregoing discussion is intended to be illustrative only; the invention is limited and defined only by the following claims and equivalents thereto.

What is claimed is:

1. A method for manufacturing a semiconductor device, comprising the steps of:

forming a first ion implantation expendable film on a first conductive type semiconductor substrate;

forming a film for an etching mask on said first ion implantation expendable film;

patterning said film for the etching mask into a shape of an active region and of a field region;

forming a first mask pattern by a photolithography method in accordance with said film for the etching mask which has been patterned;

introducing first or second conductive type dopant into said first conductive type semiconductor substrate;

forming a trench groove on said first conductive type semiconductor substrate, after removing said mask pattern, by an etching method using said film for the etching mask as a mask;

forming an insulation film in said trench groove;

forming a first well by carrying out an annealing thermal treatment;

flattening said insultation film after forming said trench groove;

selectively removing said film for the etching mask;

removing the whole of said first ion implantation expendable film;

forming a second ion implantation expendable film on said first conductive type semiconductor substrate;

forming a second mask pattern shape by a photolithography method in accordance with said trench groove; and forming a second well by introducing another first or second conductive type dopant into said first conductive type semiconductor substrate.

2. A method for manufacturing a semiconductor device according to claim 1 wherein said first well is a well for a high voltage metal oxide semiconductor (MOS) transistor, and said second well is a well for a fine metal oxide semiconductor transistor.

3. A method for manufacturing a semiconductor device according to claim 2, wherein said step for forming said second well by introducing said first or second conductive type dopant into said first conductive type semiconductor substrate comprises a plurality of ion introducing steps.

4. A method for manufacturing a semiconductor device according to claim 3, wherein the temperature of said annealing thermal treatment is in a range between about 1,000 and 1,200° C.

5. A method for manufacturing a semiconductor device according to claim 4, wherein said step of forming said insulation film in said trench groove comprises a step of forming a first insulation film on inner surfaces of said trench groove and a step of forming a second insulation film for filling said trench groove.

6. A method for manufacturing a semiconductor device according to claim 3, wherein said step of forming said insulation film in said trench groove comprises a step of forming a first insulation film on inner surfaces of said trench groove and a step of forming a second insulation film for filling said trench groove.

7. A method for manufacturing a semiconductor device according to claim 2, wherein the temperature of said annealing thermal treatment is in a range between about 1,000 and 1,200° C.

8. A method for manufacturing a semiconductor device according to claim 7, wherein said step of forming said insulation film in said trench groove comprises a step of forming a first insulation film on inner surfaces of said trench groove and a step of forming a second insulation film for filling said trench groove.

9. A method for manufacturing a semiconductor device according to claim 2, wherein said step of forming said insulation film in said trench groove comprises a step of forming a first insulation film on inner surfaces of said trench groove and a step of forming a second insulation film for filling said trench groove.

10. A method for manufacturing a semiconductor device according to claim 1, wherein said step for forming said second well by introducing first or second conductive type dopant into said first conductive type semiconductor substrate comprises a plurality of ion introducing steps.

11. A method for manufacturing a semiconductor device according to claim 10, wherein the temperature of said annealing thermal treatment is in a range between about 1,000 and 1,200° C.

12. A method for manufacturing a semiconductor device according to claim 11, wherein said step of forming said insulation film in said trench groove comprises a step of forming a first insulation film on inner surfaces of said trench groove and a step of forming a second insulation film for filling said trench groove.

13. A method for manufacturing a semiconductor device according to claim 10, wherein said step of forming said insulation film in said trench groove comprises a step of forming a first insulation film on inner surfaces of said trench groove and a step of forming a second insulation film for filling said trench groove.

14. A method for manufacturing a semiconductor device according to claim 1, wherein the temperature of said annealing thermal treatment is in a range between about 1,000 and 1,200° C.

15. A method for manufacturing a semiconductor device according to claim 14, wherein said step of forming said insulation film in said trench groove comprises a step of forming a first insulation film on inner surfaces of said trench groove and a step of forming a second insulation film for filling said trench groove.

16. A method for manufacturing a semiconductor device according to claim 1, wherein said step of forming said insulation film in said trench groove comprises a step of forming a first insulation film on inner surfaces of said trench groove and a step of forming a second insulation film for filling said trench groove.

* * * * *